United States Patent [19]
Ono

[11] Patent Number: 5,865,421
[45] Date of Patent: Feb. 2, 1999

[54] VALVE STRUCTURE FOR USE IN A VAPORIZER

[75] Inventor: Hirofumi Ono, Shiga-ken, Japan

[73] Assignee: Lintec Co., Ltd., Shiga-ken, Japan

[21] Appl. No.: 732,721

[22] Filed: Oct. 18, 1996

[30] Foreign Application Priority Data

| Dec. 13, 1995 | [JP] | Japan | 7-347266 |
| Jul. 25, 1996 | [JP] | Japan | 8-215348 |
| Aug. 8, 1996 | [JP] | Japan | 8-227900 |

[51] Int. Cl.$^6$ ............................................. F16K 31/02
[52] U.S. Cl. ............... 251/129.02; 137/341; 251/129.17; 251/331; 251/129.03; 427/248.1
[58] Field of Search ..................... 137/341, 334, 137/605; 251/129.17, 129.02, 331, 129.03, 14; 4277/248.1

[56] References Cited

U.S. PATENT DOCUMENTS

| 3,915,193 | 10/1975 | Rutt | 137/341 |
| 5,201,341 | 4/1993 | Saito et al. | 137/341 |
| 5,419,924 | 5/1995 | Nagashima et al. | 137/605 |
| 5,440,887 | 8/1995 | Nishizato et al. | 137/341 |

*Primary Examiner*—Denise L. Ferensic
*Assistant Examiner*—John Ball
*Attorney, Agent, or Firm*—Oblon, Spivak, McClelland, Maier & Neustadt, P.C.

[57] ABSTRACT

A valve structure for use in a vaporizer is provided including: a valve seat 16 confronting a vaporization area Y in which a liquid feedstock 106 is to be vaporized and having a liquid feedstock feeding port 15a for introducing the liquid feedstock 106 into the vaporization area Y, and a valve body 1 movable so as to abut against and depart from the valve seat 16 for opening/closing a flow channel extending from the liquid feedstock feeding port 15a to the vaporization area Y, the valve body 1 being capable of controlling the degree of opening of the flow channel thus opened thereby controlling the flow rate of the liquid feedstock 106 flowing through the flow channel into the vaporization area Y.

6 Claims, 9 Drawing Sheets

VALVE STRUCTURE FOR USE IN A VAPORIZER

BACKGROUND OF THE INVENTION

1. Field of the Invention

The present invention relates to a valve structure for use in a liquid feedstock vaporizer mainly used in fabricating semiconductor devices and the like.

2. Description of the Prior Art

In the fabrication of semiconductor devices, CVD apparatus (chemical vapor deposition apparatus) play a very important role and are often used as one of film-forming apparatus. Liquid compounds such as TEOS, TEB and TMOP are used as film-forming materials. In using such liquid compounds, they are required to be vaporized by any means.

A liquid vaporizer/feeder incorporating a combination of a mass flowmeter and a vaporizer has been developed and widely used as one of such vaporization means. A typical system for feeding gas into a CVD apparatus in a semiconductor device fabricating process is schematically illustrated in FIG. 1. Although the vaporizer in FIG. 1 is constructed in accordance with the present invention which will be descried later, other components are similarly to conventional ones and, hence, the conventional system will be explained with reference to this drawing for convenience.

A liquid feedstock 106 such as TEOS in a liquid container 105 is pressurized by a pressurizing gas 107 (typically helium) and fed into a liquid mass flowmeter 101. A flow rate control signal from the liquid mass flowmeter 101 is transmitted to a vaporizer 100 in which the flow rate of the liquid feedstock 106 is controlled to a given value. A carrier gas 108 comprising an inert gas is fed through a carrier gas mass flowmeter 104 into the vaporizer 100.

When an open/close valve incorporated in the vaporizer 100 is made open, the feedstock vaporized therein, together with the carrier gas, is fed into a CVD apparatus 102, and a film-forming process is initiated. Since the film-forming process is performed under a reduced pressure, a reaction chamber is always evacuated by a vacuum pump 108. The pressure in the CVD apparatus can always be checked by means of a pressure gauge 103.

FIG. 9 shows the main portion of a conventional vaporizer, in which an area filled with a liquid is referred to as a liquid area A, an area in which the liquid is vaporized is referred to as a vaporization area B, and an area through which the gas generated by vaporizing the liquid is carried by a carrier gas is referred to as a carriage area C.

Liquid feedstock 106 delivered from the liquid mass flowmeter 101 is introduced through a liquid inlet passage 20 into the vaporizer 100. There is provided a flow rate control valve body 23 for controlling the flow rate of the liquid feedstock 106 flowing from the liquid area A into the vaporization area B. A spring 29 acts to depress the flow rate control valve body 23 to enlarge the clearance between a valve seat 27 and a seat-abutment portion 23b of the flow rate control valve body 23 so as to provide communication between the liquid area A and the vaporization area B.

On the other hand, a control plunger 25 is kept in contact with an end portion 23a of the flow rate control valve body 23 via a diaphragm 26 by means of a flow rate control valve driving element. Accordingly, when the control plunger 25 is moved upward in the drawing, the flow rate control valve body 23 is pressed upwardly against the biasing force of the spring 29, so that the clearance between the liquid area A and the vaporization area B is closed.

Thus, the flow rate of the liquid feedstock 106 into the vaporization area B is accurately controlled by controlling the operation of the flow rate control valve body 23 through the control plunger 25.

The liquid feedstock 106 thus flowing into the vaporization area B is vaporized, carried by the carrier gas 108 through the carriage area C, and discharged through the outlet passage 22 into the CVD apparatus 102.

In the carriage area C is provided a shut-off valve body 24 for completely shutting off the liquid feedstock 106. The shut-off valve body 24, when depressed by an open/close plunger 24b connected to an open/close control driving element, shuts off the communication between the vaporization area B and carriage area C thereby to completely stop the film-forming process.

The feeding of the liquid feedstock 106 is thus controlled by using both the flow rate control valve having the flow rate control valve body 23 and the shut-off valve having the shut-off valve body 24 because the flow rate of the liquid feedstock 106 must be controlled accurately to a minute level by the flow rate control valve and, hence, the shut-off valve is provided dedicatedly for the shut-off function.

However, the provision of the shut-off valve within the carriage area C causes a disadvantage. That is, since the shut-off valve body 24 is located right above the vaporization area B in a manner to cover the area B, the evacuation efficiency in the vaporization area B is likely to decrease and hence, the internal pressure in the vaporization area B is prone to increase.

Generally, the vaporization efficiency becomes higher with a lowering pressure. Accordingly, the increase in the pressure within the vaporization area B hinders the vaporization of the liquid feedstock. As a result, the liquid feedstock will partially remain as it is without being vaporized. Such residual liquid 28 bumps in the vaporization area B and further impinges on the inner wall of the carriage area C or of the shut-off valve body 24, resulting in instantaneous vaporization. This causes a pressure fluctuation to occur in which the pressure increases and then immediately decreases.

The pressure fluctuation reaches the CVD apparatus 102 and observed at a pressure gauge 103 provided therein. Such a pressure fluctuation will seriously affect the film-formation; that is, a large pressure fluctuation results in a non-uniform semiconductor surface or an uneven film thickness, thus leading to a decrease in the yield of wafers.

It is, therefore, an object of the present invention to provide a vaporizer having a high vaporization efficiency and a less pressure fluctuation.

SUMMARY OF THE INVENTION

In accordance with a first aspect of the present invention, there is provided a valve structure for use in a vaporizer comprising:

a valve seat confronting a vaporization area in which a liquid feedstock is to be vaporized and having a liquid feedstock feeding port for introducing the liquid feedstock into the vaporization area, and a valve body movable so as to abut against and depart from the valve seat for opening/closing a flow channel extending from the liquid feedstock feeding port to the vaporization area, the valve body being capable of controlling the degree of opening of the flow channel thus opened thereby controlling the flow rate of the liquid feedstock flowing through the flow channel into the vaporization area.

With this structure, the valve body functions not only as a conventional flow rate control valve body but also as a conventional shut-off valve body, whereby there is no need to provide a shut-off valve body separately in the vaporizer. Accordingly, a decrease in vaporization efficiency due to the provision of the shut-off valve is avoided and, hence, the pressure fluctuation of the vaporizer can be reduced.

In accordance with a second aspect of the present invention, there is provided a valve structure for use in a vaporizer comprising:

a valve seat confronting a vaporization area in which a liquid feedstock is to be vaporized and having a liquid feedstock feeding port for introducing the liquid feedstock into the vaporization area, a vapor outlet passage communicating with the vaporization area for discharging a vaporized feedstock resulting from the vaporization of the liquid feedstock, a heater 10 provided in a body embracing the valve seat for heating the liquid feedstock flowing from the liquid feedstock feeding port to the vaporization area, and a valve body movable so as to abut against and depart from the valve seat for opening/closing a flow channel extending from the liquid feedstock feeding port to the vaporization area, the valve body being capable of controlling the degree of opening of the flow channel thus opened thereby controlling the flow rate of the liquid feedstock flowing through the flow channel into the vaporization area.

In accordance with a third aspect of the present invention, there is provided a valve structure for use in a vaporizer comprising:

a valve seat confronting a vaporization area in which a liquid feedstock is to be vaporized and having a liquid feedstock feeding port for introducing the liquid feedstock into the vaporization area, a carrier gas inlet passage communicating with the vaporization area, a mixed gas outlet passage communicating with the vaporization area for discharging a mixed gas of the carrier gas and a vaporized feedstock resulting from the vaporization of the liquid feedstock, a heater provided in a body embracing the valve seat for heating the liquid feedstock flowing from the liquid feedstock feeding port to the vaporization area, and a valve body movable so as to abut against and depart from the valve seat for opening/closing a flow channel extending from the liquid feedstock feeding port to the vaporization area, the valve body being capable of controlling the degree of opening of the flow channel thus opened thereby controlling the flow rate of the liquid feedstock flowing through the flow channel into the vaporization area.

According to a fourth aspect of the present invention, the valve body comprises a diaphragm movable so as to abut against and departs from the valve seat. With this feature, the heat capacity of the valve body is small and hence can be heated by the heater to a equilibrium temperature in a short time. This makes it possible to shorten the period of time required to attain the steady operation of the vaporizer from the actuation thereof.

The foregoing and other objects, features and attendant advantages of the present invention will become apparent from the following detailed description of the preferred embodiments of the invention in conjunction with the accompanying drawings.

DETAILED DESCRIPTION OF THE PREFERRED EMBODIMENTS

The preferred embodiments of the present invention will now be described in detail with reference to the accompanying drawings.

Figure 1:
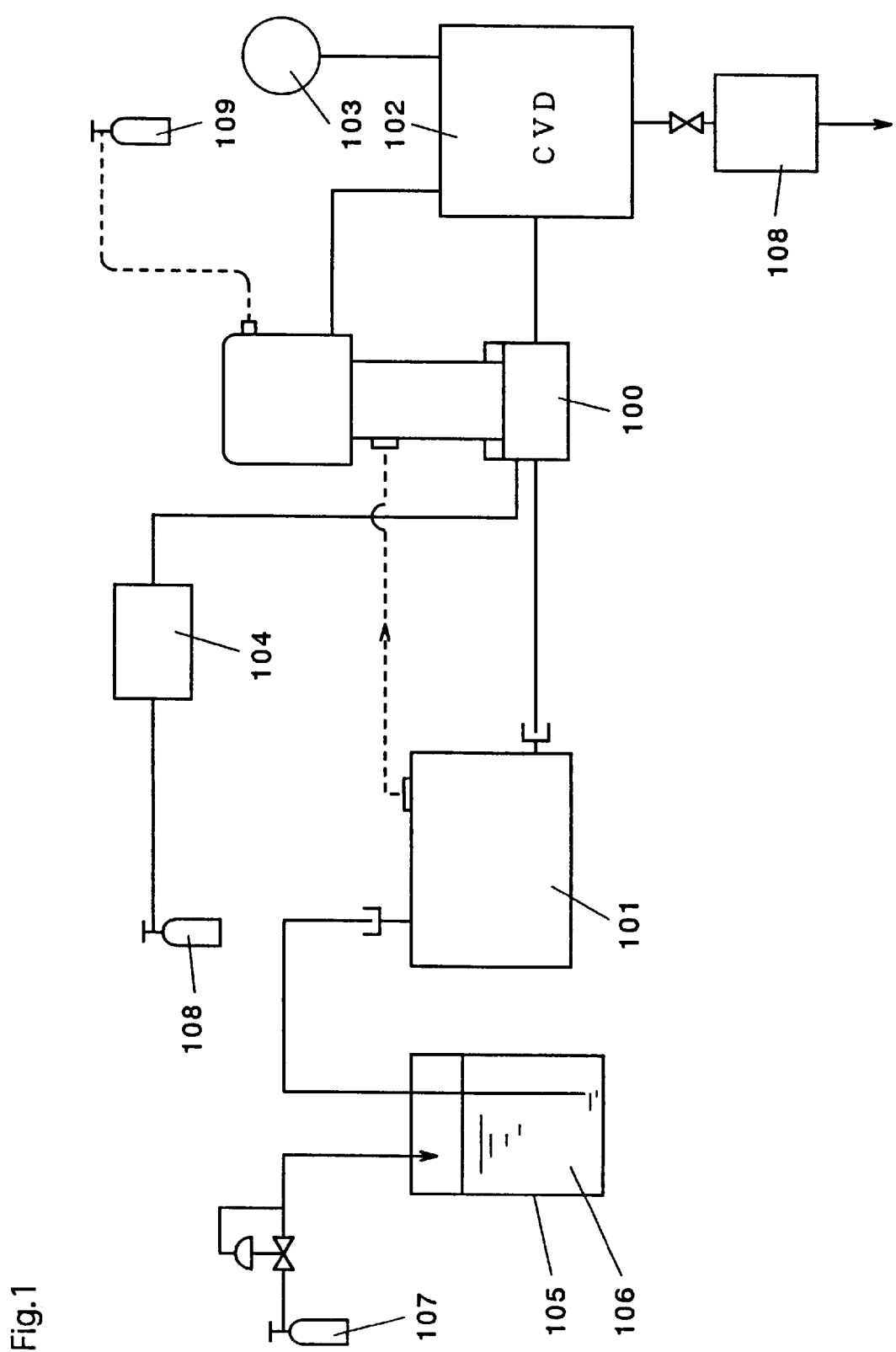
FIG. 1 is a block diagram illustrating a film-forming system incorporating a vaporizer according to the present invention.
Figure 2:
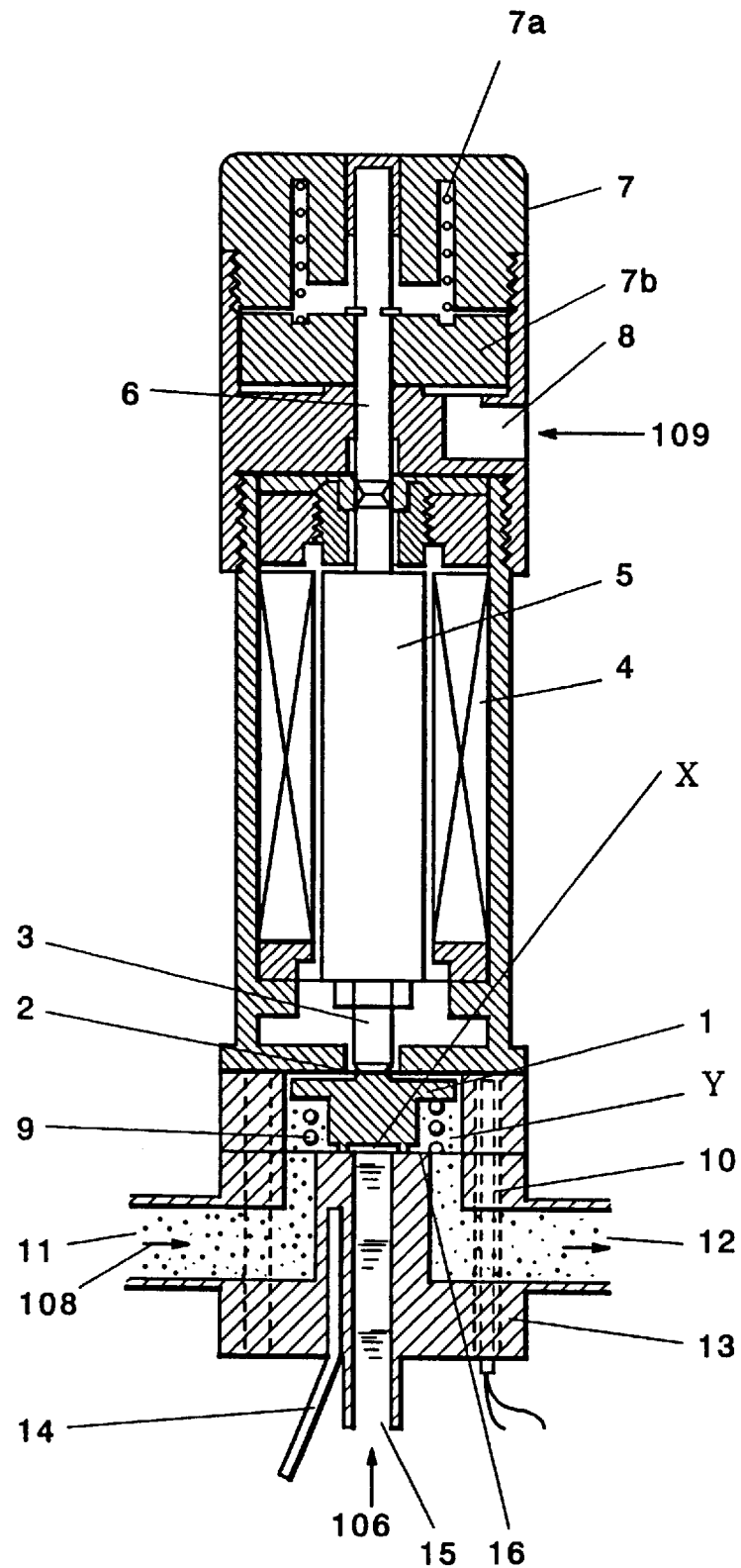
FIG. 2 is a sectional view of a vaporizer in accordance with a first embodiment of the present invention.

A film-forming system using a vaporizer in accordance with the present invention is schematically shown in FIG. 1. Since the components of the system other than the vaporizer are similar to those of a conventional one described earlier, the explanation thereof is omitted herein. FIG. 2 is a sectional view of a vaporizer in accordance with a first embodiment of the present invention.

Figure 3:
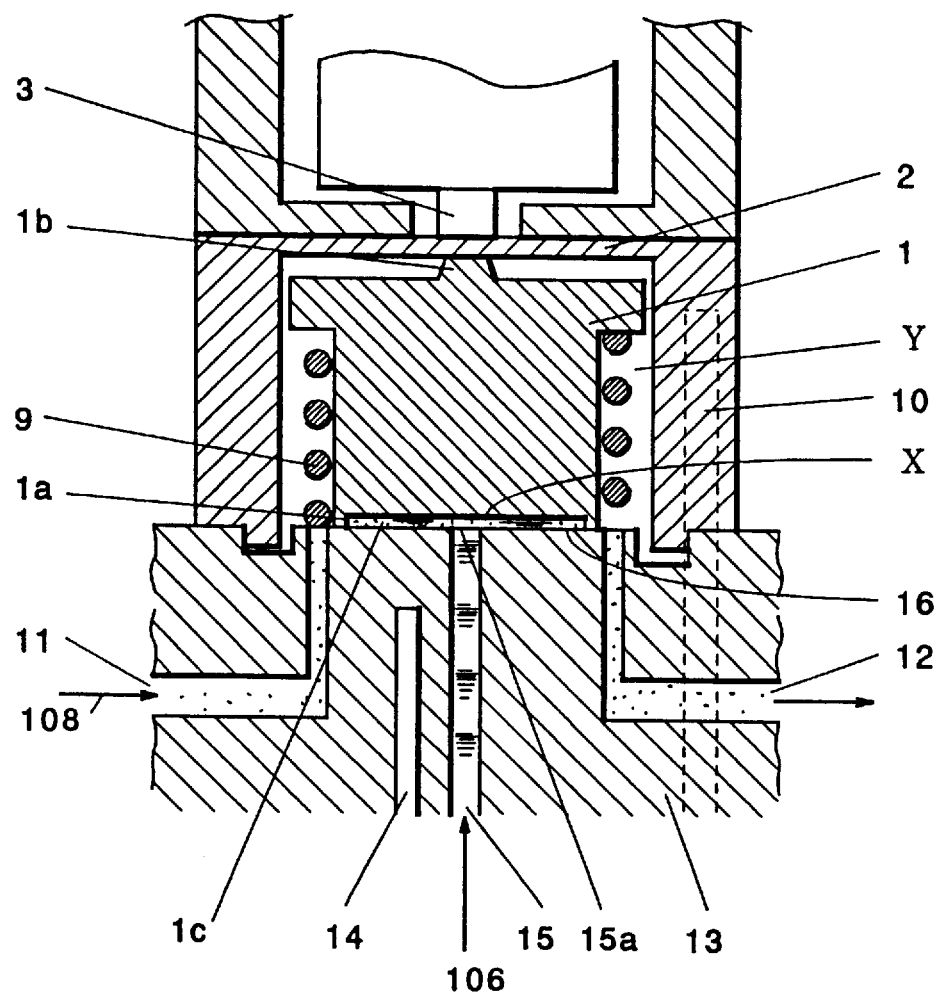
FIG. 3 is a fragmentary, enlarged sectional view illustrating a valve portion of the vaporizer shown in FIG. 2.

Referring to FIG. 3 showing in enlarged section the valve portion of the vaporizer shown in FIG. 2, the vaporizer includes a liquid area X which is filled with a feedstock 106 in a liquid state, and a vaporization area Y in which the liquid feedstock 106 is to be vaporized.

A valve body 1 in the form of a block is provided for controlling the feeding rate of liquid feedstock 1. The valve body 1 acts not only to control the flow rate to a minute level by controlling the degree of opening of a flow channel but also to shut off the supply of the liquid feedstock 106. In other words, the valve body 1 serves not only as a flow rate control valve body but also as a shut-off valve body in a conventional vaporizer. The valve body 1 may be formed of a synthetic resin such as a fluoroplastic (PTFE or CPTFE) or polyimide, or a corrosion-resistant metal.

Liquid feedstock 106 introduced through a liquid inlet passage 15 defined in a body 13 is fed through a liquid feedstock feeding port 15a provided substantially centrally of the valve seat 16 into the liquid area X. The flow rate of the liquid feedstock 106 from the liquid area X into the vaporization area Y is controlled by the movement of the valve body 1 (that is, by the degree of opening of the valve body, or the distance between the seat-abutment portion 1a of the valve body 1 and the valve seat 16). The liquid area X comprises a space defined by a recessed portion 1c formed in a bottom surface of the valve body 1 and the valve seat 16. The seat-abutment portion 1a of the valve body 1 which is adapted to abut against and depart from the valve seat 16 is protrusively provided around the recessed portion 1c.

A spring 9 urges the valve body 1 upwardly to widen the clearance between the seat-abutment portion 1a of the valve body 1 and the valve seat 16 for providing communication between the liquid area X and the vaporization area Y. On the other hand, a flow rate control driving element 4 comprising a solenoid or a laminated piezo-electric element actuates a flow rate control plunger 3 through a magnetic core 5 of the solenoid is used, or through a contacting end of the piezoelectric element. The flow rate control plunger 3 depresses an end portion 1*b* of the valve body 1 toward the valve seat 16 through a diaphragm 2 against the spring 9. Thus, the flow rate control driving element 4 comprises second drive means which controls the position of the valve body 1 thereby achieving accurate and minute control of the flow rate. Such positional control is achieved by feeding back the flow rate measured by the mass flowmeter 101 to the flow rate control driving element 4.

The liquid feedstock 106 flowing through the clearance between the seat-abutment portion 1*a* of the valve body 1 and the valve seat 16 at a certain rate is immediately exposed to a reduced pressure atmosphere and heated by the heater 10, so as to be quickly expanded and instantaneously vaporized.

Unlike the conventional valve structure, the valve structure of the present invention has no provision of a shut off valve at a portion in the vaporization area Y where the liquid feedstock 106 comes out and, hence, a sufficiently large feedstock conduction can be obtained. Accordingly, complete vaporization can be achieved with no feedstock remaining in a liquid state. It should be noted that reference numeral 14 designates a thermo-couple for measuring the temperature of the body 13.

Vaporized feedstock resulting from the vaporization of the liquid feedstock 106 is mixed with a carrier gas introduced through a carrier gas inlet passage 11, fed to a mixed gas outlet passage 12 and then to a CVD apparatus 102.

Where vaporizer 100 is directly connected to CVD apparatus 102, the carrier gas is not necessarily required. In such a case, the carrier gas inlet passage 11 may not be provided or shut off by providing a valve or the like.

Figure 4:
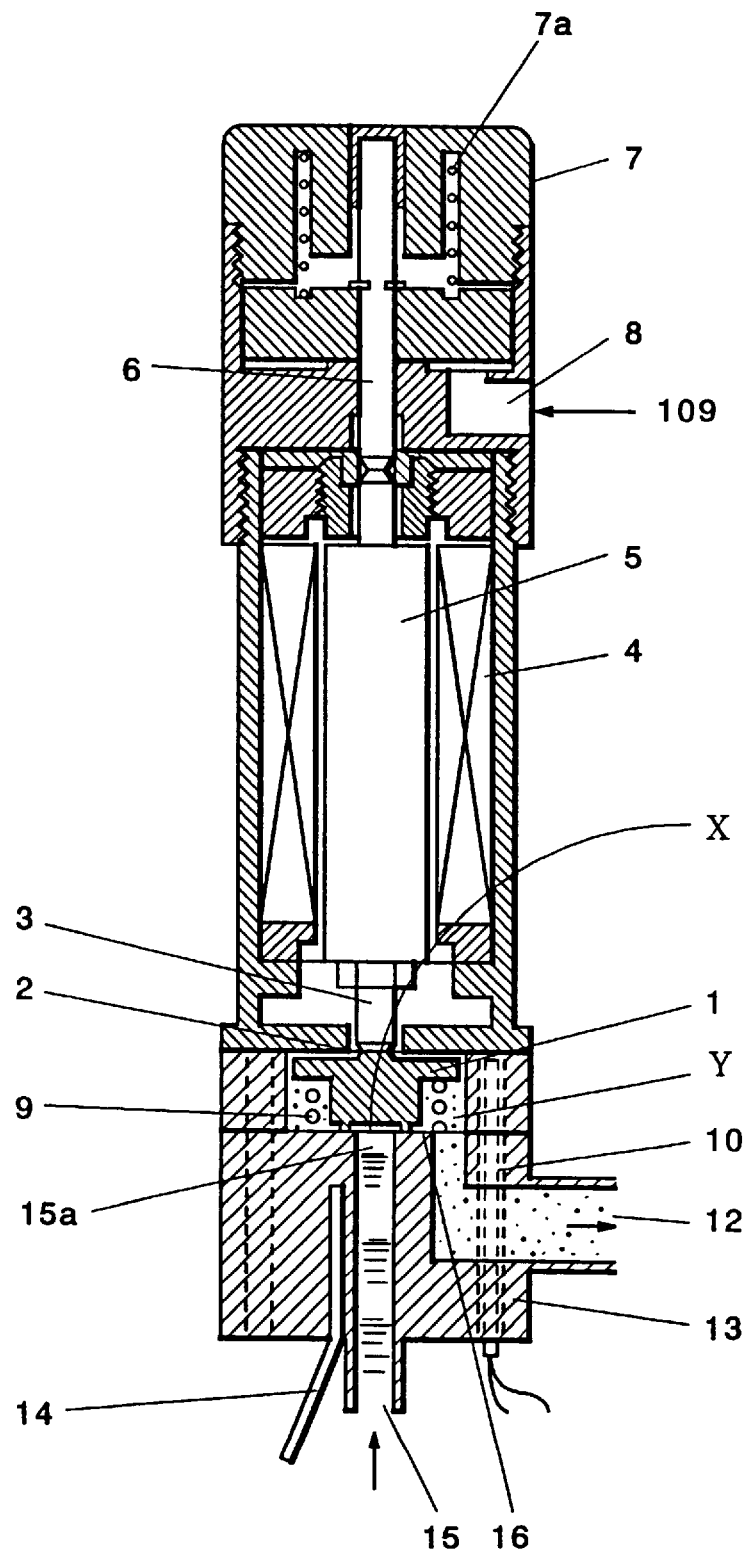
FIG. 4 is a sectional view of a vaporizer in accordance with a variation of the first embodiment of the present invention wherein a carrier gas is not used.
Figure 5:
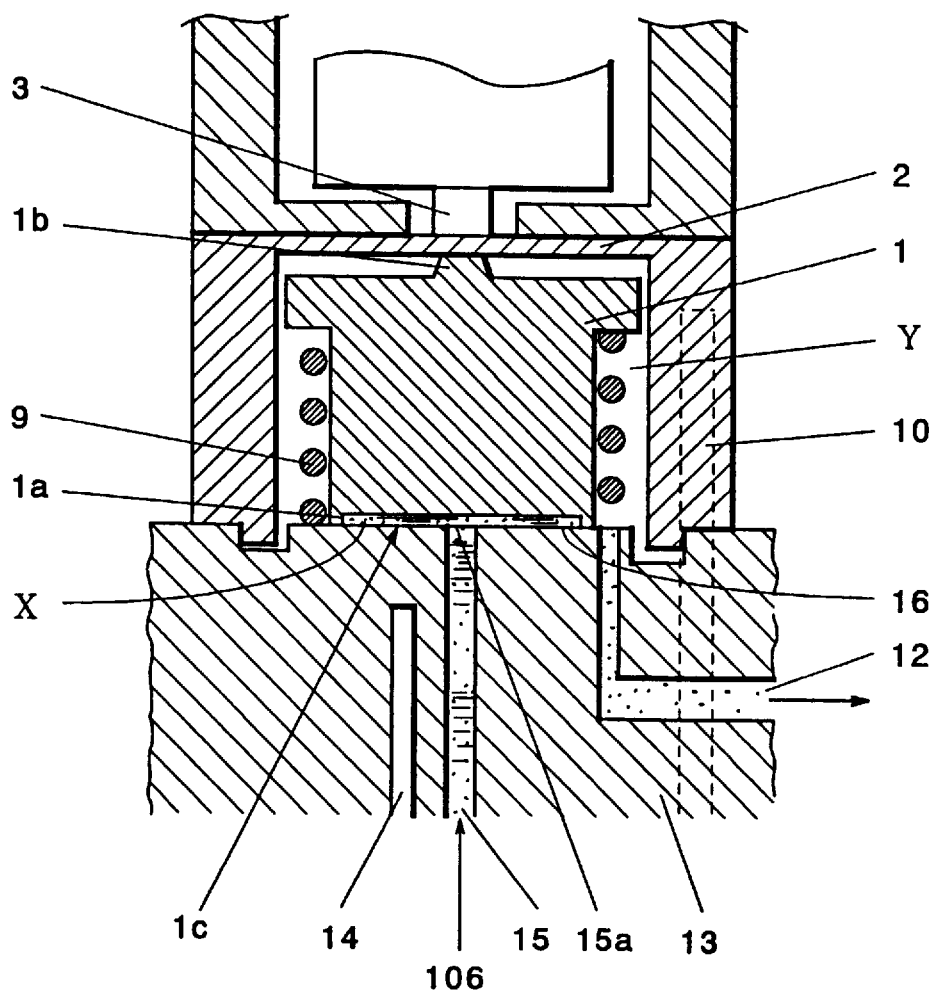
FIG. 5 is a fragmentary, enlarged sectional view illustrating a valve portion of the vaporizer shown in FIG. 4.

A vaporizer in accordance with a variation of the first embodiment wherein a carrier gas is not employed is illustrated in section in FIG. 4, and the valve portion thereof is illustrated in enlarged section in FIG. 5.

In finishing the process, the supply of pressurizing gas 109 into a pressurizing gas inlet passage 8 is stopped so as to allow the gas in the vaporizer to escape, and then an open/close plunger 6 is actuated by means of a spring 7*a*. In a film-forming process of semiconductor device fabrication, since a liquid feedstock, if left as it is in a vaporizer, would exert a bad influence to a wafer, complete shut-off of the valve is required to be achieved in a short time and, hence, a single-acting pneumatic valve 7*b* using a spring 7*a* biasing in the shut-off direction is employed as a driving element 7 for open/close control.

Since the open/close plunger 6 is provided in line with the flow rate control plunger 3, it comes to abut against the upper end of the flow rate control plunger 3 and depress the plunger 3 when actuated. This causes the valve body 1 to move downwardly, so that the seat-abutment portion 1*a* of the valve body 1 abuts against the valve seat 16 and so comprises first drive means, the second drive means being separate from the first drive means. As a result, the communication between the liquid area X and the vaporization area Y is shut off and, thus, vaporization of the liquid feedstock 106 is stopped. Conversely, in starting the process, feeding the pressurizing gas into the vaporizer causes the open/close plunger 6 to depart from the flow rate control plunger 3 by the operation of the pneumatic valve 7*b*. Thus, the vaporizer becomes ready to control the position of the valve body 1, or to control the flow rate of the liquid feedstock 106.

Figure 6:
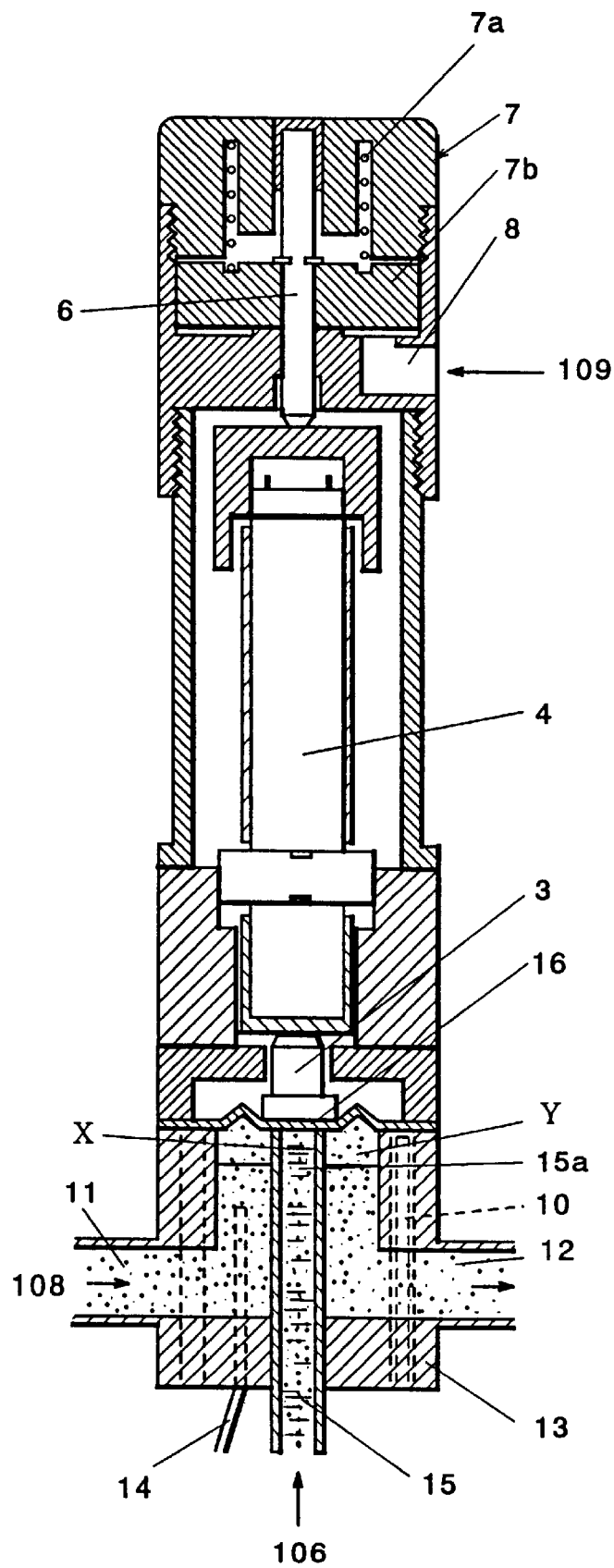
FIG. 6 is a sectional view of a vaporizer in accordance with a second embodiment of the present invention, in which a valve is in a closed position.
Figure 7:
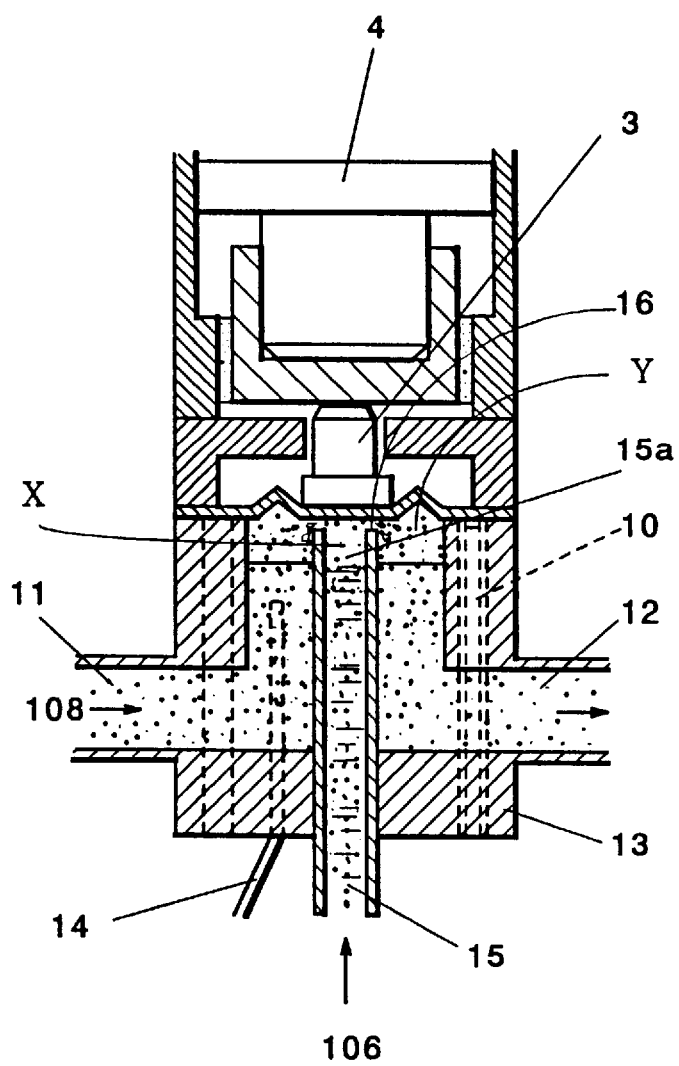
FIG. 7 is a fragmentary, enlarged sectional view illustrating a valve portion of the vaporizer shown in FIG. 6, in which the valve is in an open position.

Next, a vaporizer in accordance with a second embodiment of the present invention is to be described with reference to FIGS. 6 and 7. Like reference numerals are used to denote like or corresponding portions of the first and second embodiments throughout the drawings for omitting the explanation thereof.

In the second embodiment, a diaphragm is used as valve body 1. The diaphragm valve body 1 has a circular disc shape as is usually used and formed with a concentric annular projection or depression 1*d*. In this embodiment a single annular projection or depression is formed. The periphery of the diaphragm is restrained by the body 13. When the central portion of the diaphragm valve body 1 is depressed, it bends in the depressing direction, whereas when the depressing force is removed, it returns to its initial form by its own tension.

A liquid inlet passage 15 extends to the central portion of the valve body 1, and a carrier gas inlet passage 11 and a mixed gas outlet passage 12 are disposed on the opposite sides of the liquid inlet passage 15. The diaphragm valve body 1 extending right above the liquid inlet passage 15 is adapted to abut against and depart from liquid feedstock feeding port 15*a* but not to abut against the carrier gas inlet passage 11 nor against the mixed gas outlet passage 12. Thus, the space defined between the diaphragm valve body 1 and the carrier gas inlet passage 11 and the mixed gas outlet passage 12 serves as vaporization area Y. In this embodiment, since the diaphragm valve body is movable so as to directly abut against or depart from the liquid feedstock feeding 15*a* and there is not provided with recessed portion 1*c* in the bottom surface of the valve body 1 as in the first embodiment, the liquid area X in this embodiment extends to and terminates at the liquid feedstock feeding port 15*a*.

The diaphragm valve body 1 may also be formed of a synthetic resin such as a fluoroplastic (PTFE or CPTFE) or polyimide, or a corrosion-resistant metal.

Flow rate control driving element 4 used in the second embodiment may also comprise a solenoid or a laminated piezoelectric element for pressing the diaphragm valve body 1 via flow rate control plunger 3. Since the diaphragm valve body 1 has its own tension, it follows the movement of the flow rate control plunger 3. That is, when the flow rate control driving element 4 operates to depress the diaphragm valve body 1 via the flow rate control plunger 3, the diaphragm valve body 1 closely contacts the liquid feedstock feeding port 15*a*, so that the supply of liquid feedstock 106 is stopped. When the flow rate control driving element 4 operates in the reverse direction, the diaphragm valve body 1 departs from the liquid feedstock feeding port 15*a*, so that the feeding of the liquid feedstock 106 into the vaporization area Y is initiated.

The valve body 1 comprising a thin diaphragm has a small heat capacity unlike the block form valve body of the first embodiment and hence can be heated up to an equilibrium temperature in a short time when starting. Accordingly, there is an advantage that the start-up time required is very short. Further, the small weight of such a thin diaphragm allows quick movements and high responsiveness.

Figure 8:
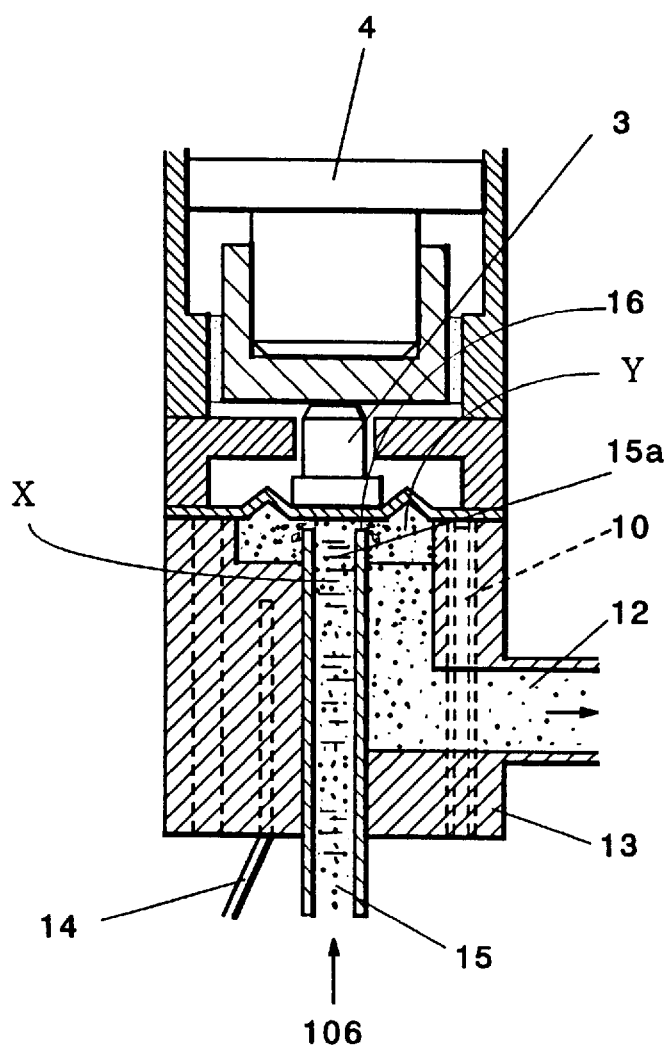
FIG. 8 is a fragmentary, enlarged sectional view illustrating a vaporizer in accordance with a variation of the second embodiment of the present invention wherein a carrier gas is not used.
Figure 9:
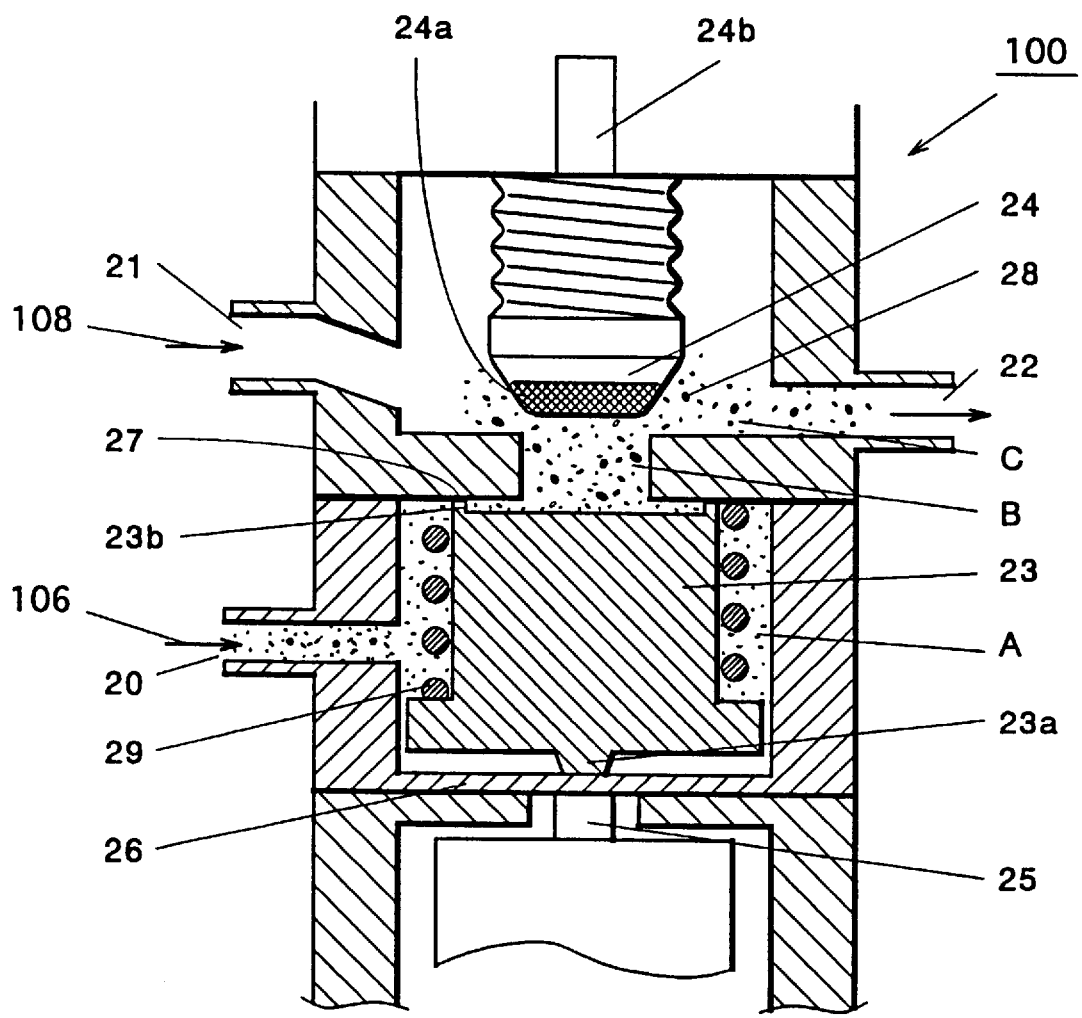
FIG. 9 is a fragmentary, enlarged sectional view illustrating a valve portion of a conventional vaporizer.

Similarly to the first embodiment, there is a variation of the second embodiment wherein a carrier gas is not needed, which is shown in section in FIG. 8.

Flow rate fluctuation measured by the mass flowmeter 101 in the invention was examined and the results shown in Table 1 was obtained. Flow rate fluctuation in a vaporizer having a conventional valve structure was also examined and shown in Table 1 for comparison.

TABLE 1

| | Flow rate fluctuation (mg) | |
|---|---|---|
| Preset flow rate (mg/min) | the invention | prior art |
| 1000 | ±4.2 to 4.6 | ±4.6 to 9.0 |
| 800 | ±3.0 to 3.6 | ±11.2 |
| 600 | ±2.6 to 3.8 | ±17.2 to 19.0 |
| 400 | ±2.0 to 2.6 | ±7.2 to 11.2 |
| 200 | ±2.6 | ±3.8 |

As can be seen from the results, the flow rate fluctuation was reduced down to about one-fifth of that of the conventional vaporizer. Thus, flow rate fluctuation which will directly influence the film forming performance of a CVD apparatus can be considerably reduced in accordance with the present invention.

Complete and efficient vaporization thus realized by the invention enhances the formation of a film having an even thickness, reduces the proportion of defects, and ensures semiconductor devices of improved performance.

As has been described, the present invention provides a vaporizer which ensures a high vaporization efficiency and a less pressure fluctuation thereby enhancing the precision of film formation. Thus, the yield of wafers can be increased. Further, the use of a diaphragm valve body enables the starting up time of the vaporizer to be reduced, so that the responsiveness of the valve body is enhanced.

While only certain presently preferred embodiments of the present invention have been described in detail, as will be apparent for those skilled in the art, certain changes and modifications can be made in embodiment without departing from the spirit and scope of the invention as defined by the following claims.

What is claimed is:

1. A valve structure for use in a vaporizer comprising:

a valve seat confronting a vaporization area in which a liquid feedstock is to be vaporized and having a liquid feedstock feeding port for introducing the liquid feedstock into the vaporization area, a valve body movable so as to abut against and depart from the valve seat for opening/closing a flow channel extending from the liquid feedstock feeding port to the vaporization area, and drive means for driving said valve body, comprising both first drive means for opening and closing the flow channel and second drive means separate from said first drive means for minutely controlling the degree of opening of the flow channel thus opened thereby controlling the flow rate of the liquid feedstock flowing through the flow channel into the vaporization area.

2. A valve structure for use in a vaporizer comprising:

a valve seat confronting a vaporization area in which a liquid feedstock is to be vaporized and having a liquid feedstock feeding port for introducing the liquid feedstock into the vaporization area, a vapor outlet passage communicating with the vaporization area for discharging a vaporized feedstock resulting from the vaporization of the liquid feedstock, a heater provided in a body embracing the valve seat for heating the liquid feedstock flowing from the liquid feedstock feeding port to the vaporization area, and a valve body movable so as to abut against and depart from the valve seat for opening/closing a flow channel extending from the liquid feedstock feeding port to the vaporization area, and drive means for driving said valve body comprising both first drive means for opening and closing the flow channel and second drive means separate from said first drive means for minutely controlling the degree of opening of the flow channel thus opened thereby controlling the flow rate of the liquid feedstock flowing through the flow channel into the vaporization area.

3. A valve structure for use in a vaporizer comprising:

a valve seat confronting a vaporization area in which a liquid feedstock is to be vaporized and having a liquid feedstock feeding port for introducing the liquid feedstock into the vaporization area, a carrier gas inlet passage communicating with the vaporization area, a mixed gas outlet passage communicating with the vaporization area for discharging a mixed gas of the carrier gas and a vaporized feedstock resulting from the vaporization of the liquid feedstock, a heater provided in a body embracing the valve seat for heating the liquid feedstock flowing from the liquid feedstock feeding port to the vaporization area, and a valve body movable so as to abut against and depart from the valve seat for opening/closing a flow channel extending from the liquid feedstock feeding port to the vaporization area, and drive means for driving said valve body, comprising both first drive means for opening and closing the flow channel and second drive means separate from said first drive means for minutely controlling the degree of opening of the flow channel thus opened thereby controlling the flow rate of the liquid feedstock flowing through the flow channel into the vaporization area.

4. A valve structure as set forth in claim 1, wherein the valve body comprises a diaphragm movable so as to abut against and depart from the valve seat.

5. A valve structure as set forth in claim 2, wherein the valve body comprises a diaphragm movable so as to abut against and depart from the valve seat.

6. A valve structure as set forth in claim 3, wherein the valve body comprises a diaphragm movable so as to abut against and depart from the valve seat.

* * * * *